United States Patent [19]

Armiento et al.

[11] Patent Number: 5,077,878

[45] Date of Patent: Jan. 7, 1992

[54] METHOD AND DEVICE FOR PASSIVE ALIGNMENT OF DIODE LASERS AND OPTICAL FIBERS

[75] Inventors: Craig A. Armiento, Acton; Chirravuri Jagannath, Medfield; Marvin J. Tabasky, West Peabody; Thomas W. Fitzgerald, Framingham; Harry F. Lockwood, Waban; Paul O. Haugsjaa; Mark A. Rothman, both of Acton; Vincent J. Barry, Framingham; Margaret B. Stern, Sudbury, all of Mass.

[73] Assignee: GTE Laboratories Incorporated, Waltham, Mass.

[21] Appl. No.: 551,219

[22] Filed: Jul. 11, 1990

[51] Int. Cl.⁵ .................... H01L 21/02; H01L 21/20; H01L 21/302

[52] U.S. Cl. .................. 29/25.02; 437/906; 148/DIG. 95

[58] Field of Search ............ 350/96.11, 96.15, 96.17, 350/96.20; 29/569.1; 29/25.02; 148/DIG. 95; 437/904, 905, 906

[56] References Cited

U.S. PATENT DOCUMENTS 4,750,799  6/1988  Kawachi et al. ............... 350/96.11
4,930,854  6/1990  Albares et al. ................ 350/96.17

FOREIGN PATENT DOCUMENTS 0134882  8/1984  Japan ........................... 437/906
0223185  11/1985  Japan ........................... 372/50

Primary Examiner—Olik Chaudhuri
Assistant Examiner—Loc Trinh
Attorney, Agent, or Firm—Victor F. Lohmann, III

[57] ABSTRACT

A method of passively aligning optical receiving elements such as fibers to the active elements of a light generating chip includes the steps of forming two front and one side pedestal structures on the surface of a substrate body, defining a vertical sidewall of the chip to form a mating channel having an edge at a predetermined distance from the first active element, mounting the chip epi-side down on the substrate surface, and positioning the fibers in fiber-receiving channels to that a center line of each fiber is aligned to a center line of a respective active element. When mounted, the front face of the chip is abutting the contact surfaces of the two front pedestals, and the defined sidewall of the mating channel is abutting the contact surface of the side pedestal. The passive alignment procedure is also effective in aligning a single fiber to a single active element.

17 Claims, 4 Drawing Sheets

METHOD AND DEVICE FOR PASSIVE ALIGNMENT OF DIODE LASERS AND OPTICAL FIBERS

FIELD OF THE INVENTION

The present invention relates to optical component packaging and, more particularly, to the passive alignment of diode lasers to optical fibers using precisely located mechanical registration features on a substrate body.

BACKGROUND OF THE INVENTION

Long-haul optical telecommunication networks currently utilize high performance optoelectronic components such as lasers and photodetectors that are coupled to single mode optical fibers. Although presently these components are expensive, their effective cost is low since they are shared among thousands of customers. The economic situation is beginning to change as telephone companies extend the optical fiber network directly to the home. Expansion of optical fiber into the local loop will require several optoelectronic, electronic and fiber components for each customer. This situation will impose significant demands on realizing optoelectronic components that can be manufactured at low cost.

The cost of all optoelectronic (and most electronic) components is dominated by the package rather than the device itself. For example, the alignment and attachment of an optical fiber pigtail and a diode laser in an optical transmitter are the most costly packaging steps. The cost of this operation for a single transmitter will be multiplied for applications involving the use of many parallel transmitters in the local loop in which arrays of lasers are coupled to arrays of single mode fibers.

In addition to telecommunication applications, the issue of low cost optoelectronic components will also determine the economic viability of other applications of optoelectronic technology such as the use of optical interconnects in high speed computers.

The conventional approach to attachment of a fiber pigtail to a diode laser package is a labor intensive process. The laser must first be die and wire bonded to the package so that it can be biased to its normal operating condition. The input end of the fiber pigtail is then mechanically manipulated in front of the laser active region while the optical output of the fiber is monitored until optimal coupling is achieved. A single mode fiber (9 $\mu$m core diameter) must be positioned with submicron accuracy in front of the laser emitting region, which typically has dimensions of about 2×0.2 $\mu$m. Once the maximum coupling has been obtained, the fiber is bonded into place. This approach requires either human interaction or expensive equipment that automatically dithers the fiber to its optimal position. An additional disadvantage is that the fiber can move from its optimal position during the process of attachment to the package due to the motion of bonding materials (such as epoxy shrinkage) or during the use of the laser in the field. This conventional alignment technique will be significantly more complicated as the need develops for the coupling of laser arrays to fiber arrays.

The alignment of fiber arrays to laser arrays has been reported for the case of multimode fibers (50 $\mu$m core diameter) by Jackson et al. in "Optical fiber coupling approaches for multichannel laser and detector arrays," SPIE Vol. 994 (1988). Although V-grooves were used to position fibers relative to the lasers in the vertical z-direction, active alignment was required to position the fibers in the lateral x and y directions. The present invention eliminates all active alignment procedures and provides alignment accuracy that will be adequate for passive alignment of single-mode fibers.

OBJECTS OF THE INVENTION

It is a principal object of the present invention to obviate the above-noted and other disadvantages of the prior art.

It is a further object of the present invention to align a laser array to a fiber array by using a strictly passive alignment procedure.

It is a further object of the present invention to provide an alignment technique which enables precise positioning of the fiber relative to the laser active region with the potential for submicron accuracy.

SUMMARY OF THE INVENTION

The present invention is directed to a method of passively aligning at least one optical receiving element to at least one active region of a light generating chip wherein the chip and receiving elements are attachable to a substrate body. The method includes the step of forming two front pedestal structures and one side pedestal at respective locations on the surface of the substrate body. A vertical sidewall is defined into the chip to form a mating channel whereby an edge of the sidewall is a predetermined distance from the active elements of the chip. The chip is preferably mounted epi-side down on the substrate surface by abutting a front face of the chip with the contact surfaces of the two front pedestals and by abutting the defined sidewall of the mating channel to the contact surface of the side pedestal. The optical receiving elements are positioned in channels relative to the locations of the pedestals and the active elements of the chip so that a center line of each receiving element is aligned to a center line of a respective active region. The method is suitable for the alignment of a single fiber to a single laser, and the alignment of an array of fibers to an array of lasers.

DETAILED DESCRIPTION OF THE PREFERRED EMBODIMENTS

The present invention discloses a method and apparatus for passive alignment of a light-receiving element to a light-emitting source, providing low cost alternatives to the conventional approach of active manipulation of the light-receiving element. The specific embodiment shown in FIG. 1 aligns a single-mode fiber array having a plurality of fibers to a diode laser array having a plurality of lasers. Alignment is accomplished by use of a micromachined substrate onto which the laser and fiber arrays are attached. The micromachined features are designed so that each laser/fiber pair is precisely positioned on the substrate and thereby automatically aligned to each other.

Figure 1:
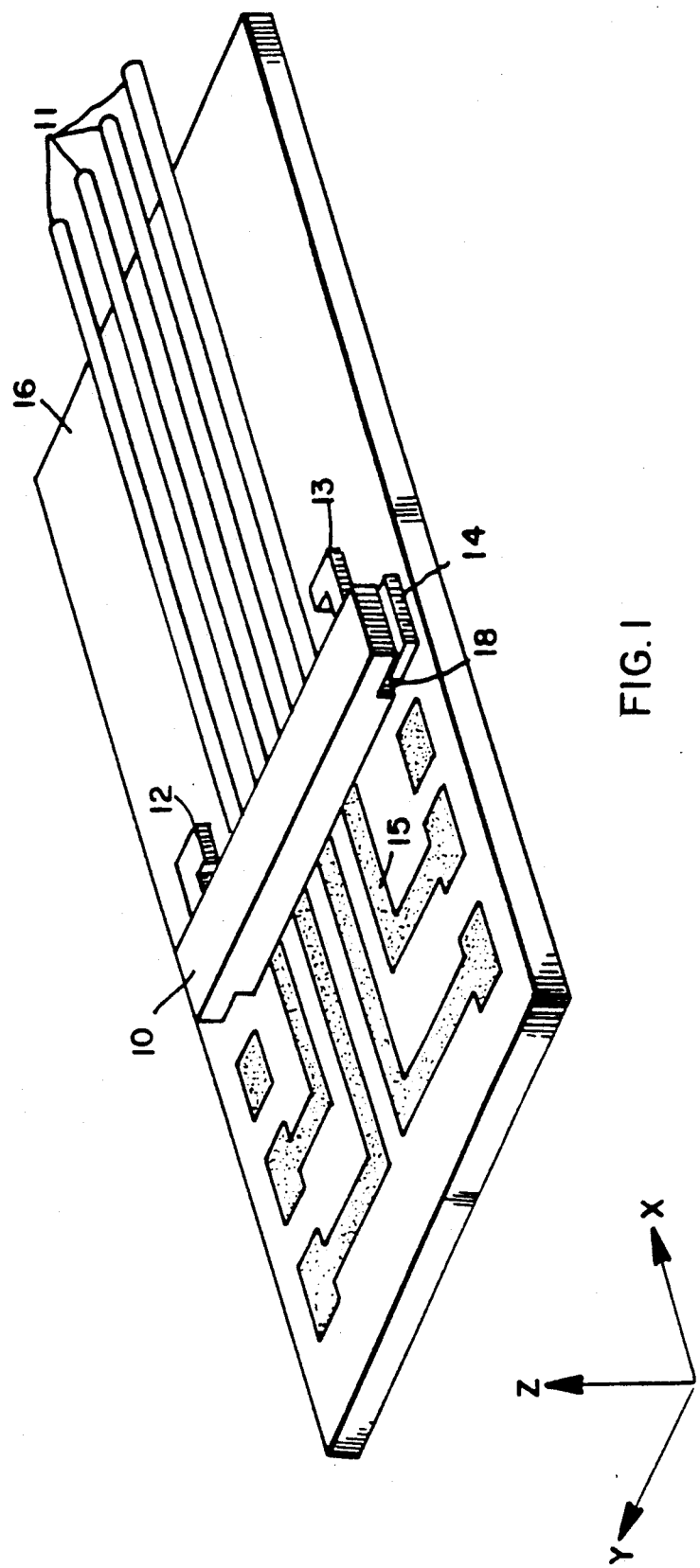
FIG. 1 is a perspective view of an optical component package illustrating the alignment of a laser array to fiber array according to one embodiment of the present invention.

FIG. 1 illustrates the passive laser/fiber alignment procedure according to the present invention for a four-element laser array chip 10 coupled into a four-fiber array 11. Photolithographic techniques such as wet chemical etching are used to fabricate V-grooves (not shown) in a silicon substrate 16 for receiving the fibers of array 11 during the alignment procedure. Although silicon is cited as an example of a substrate material in the embodiment of FIG. 1, other materials may also be used. Silicon provides an excellent substrate for defining micromachined features because of its well established processing technology.

Three pedestals 12, 13, and 14 fabricated on substrate 16 at predetermined locations serve to position the laser array chip on the substrate. The groove pitch is designed to be the same as the separation between the lasers on the array to enable alignment in the y-direction. A mating channel shown as the lip extending over pedestal 14 is fabricated into the laser chip. The laser chip is mounted epi-side down so that it is in abutting contact with a contact surface of each pedestal. The known position of the laser emitting regions with respect to the laser chip array and the location of the pedestals allow positioning of the grooves for locating the fibers in the x, y and z directions at the appropriate angular orientation so that the center line of each laser active region is aligned to the center line of each fiber. A metallization 15 pattern is used for electrical access to each element of the laser array. The substrate side of the laser would be used as a common contact for all four lasers in the array.

Laser Array/Fiber Array Alignment in the X and Y Directions

The laser array chip 10 is positioned in the x and y directions by being pushed up against the three pedestals 12, 13, and 14, where the position of the laser array in the x direction (towards the fibers) is determined by pedestals 12 and 13, while alignment of the center line of the laser active regions to the center of the fiber cores (y direction) is achieved by pedestal 14. The position of the laser array in this direction must be controlled to within 1-2 $\mu$m to obtain good optical coupling, especially if single-mode fibers are used where the core diameter is on the order of 9 $\mu$m. Achieving this degree of dimensional control requires that the edge 18 of the laser chip, which abuts pedestal 14, be a fixed distance from the active region of the nearest laser element in the array. This edge distance then serves as a reference line in the y-direction for etching of the first fiber-receiving groove. The orientation of the V-grooves on the substrate 16 determines the position of the fibers in the x and y directions. Photolithographic processing techniques, rather than conventional scribing or sawing processes, can be used to define the laser array chip edge.

Figure 2:
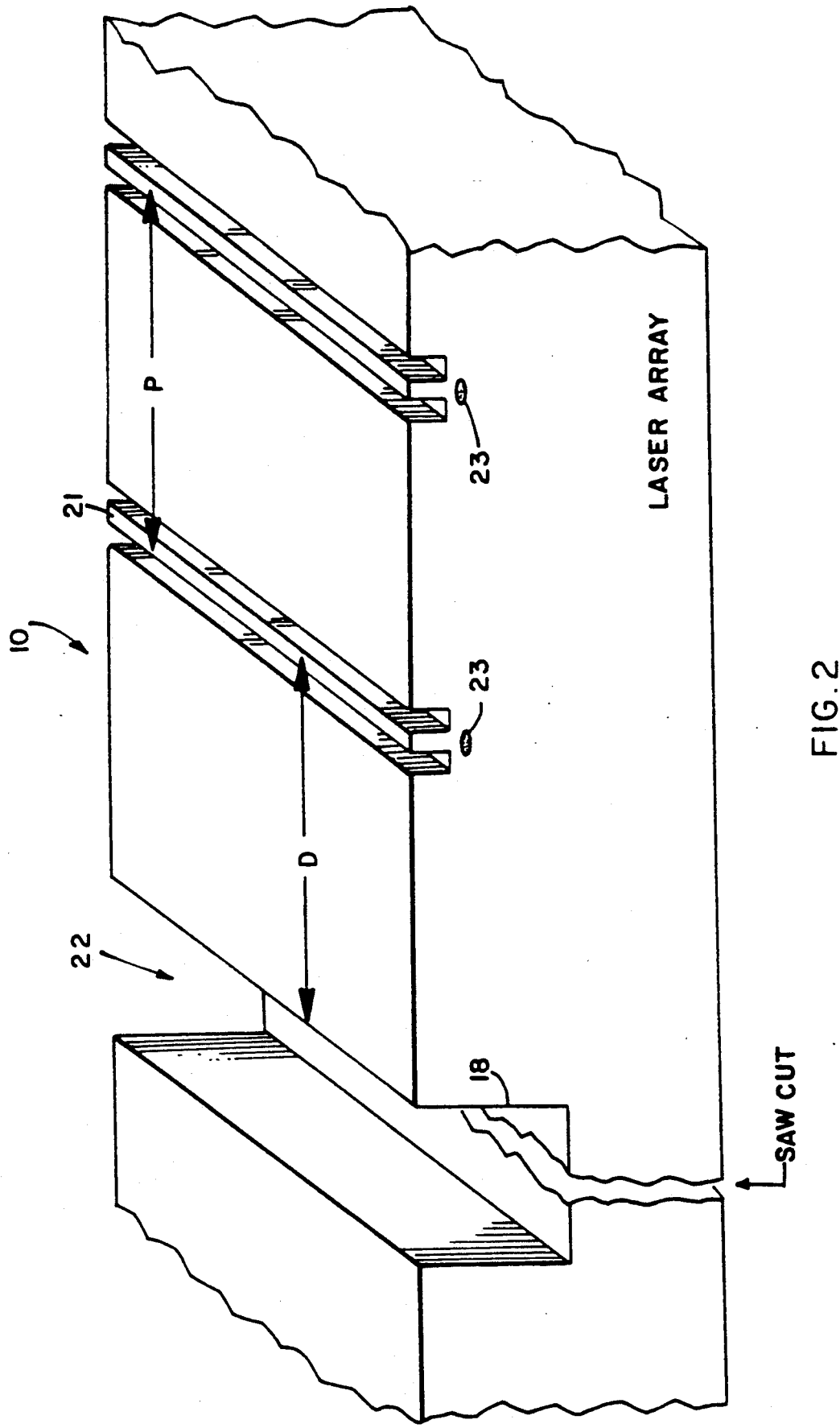
FIG. 2 shows a frontal view of a portion of the laser array structure in the embodiment of FIG. 1.

FIG. 2 shows a frontal cross-sectional portion of the laser array structure in FIG. 1 fabricated with a deep, vertical-wall mating channel 22 having an edge 18 that is positioned a fixed distance, D, from the emitting region 23 of the first laser 21 in the array. Although a double-channel ridge waveguide laser geometry is shown in FIG. 2, the chip array can be fabricated with other laser structures such as stripe geometry and buried heterostructure lasers. Metallization on the laser array surface, which would require separate electrodes for each laser in the array, has not been shown in FIG. 2 for clarity purposes.

Laser bars are cut into arrays by making a saw cut through the mating channel, leaving the vertical edge 18 that is a controlled distance (D) from the laser active region 23. When this vertical surface of the mating channel is butted up against pedestal 14, the active regions of the laser array are a distance D +np (in the y-direction) from the edge of pedestal 14 (where p is the laser pitch and n=0,1,2,3 for a four laser array). The substrate is designed so that the center of the V-grooves are located the same distances D+np from the pedestal surface abutting chip edge 18. This provides automatic alignment between the fibers and lasers in the y-direction.

Laser array/Fiber Array Alignment in the z Direction

Figure 3:
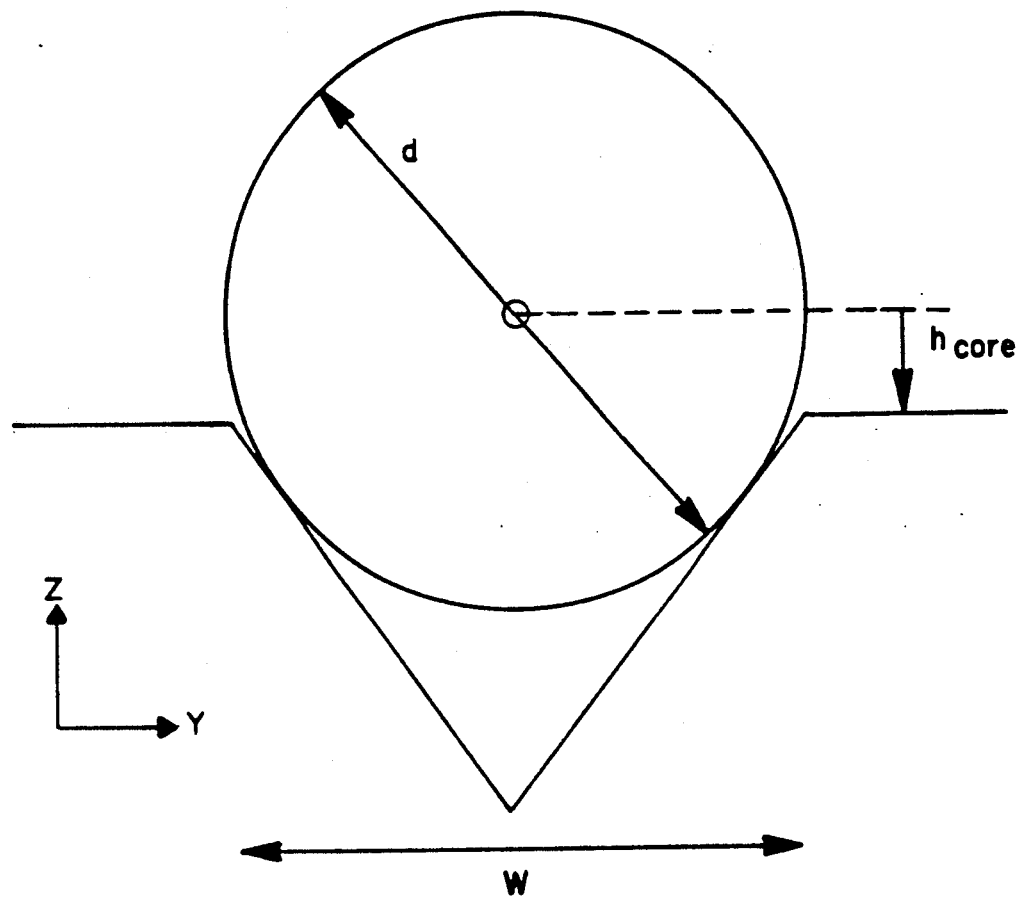
FIG. 3 is an enlarged cross-sectional view of a single fiber of the array in FIG. 1 showing the dimensional parameters of the fiber and the groove within which the fiber is positioned.

Alignment in the z direction of a fiber to its corresponding laser in array chip 10 is accomplished by fixing the fiber core and the laser active region at the same height above the surface of the substrate 16. The position of a fiber in a V-groove, shown in a cross sectional view in FIG. 3, is determined by the width, w, of the V-groove and the diameter, d, of the fiber (125 $\mu$m for conventional fibers). The height of the core center above the substrate surface, $h_{core}$, is given by the expression:

$$h_{core} = d\sqrt{3}/2 - w/\sqrt{2}.$$

Placement of the laser emitting region at a controlled height equal to hcore above the substrate surface requires a new packaging approach. Conventional laser mounting techniques (such as the use of eutectic preforms) provide virtually no control over the thickness of the solder. These soldering techniques will not be adequate to position the laser with the precision required, which is approximately ±1 $\mu$m. In the present invention, the vertical position of each laser active region (above the surface of the substrate) is controlled by the use of a corrugated laser mounting pattern that is built into the substrate surface. The mounting pattern is used in conjunction with solder metallizations having controllable thicknesses. Epi-side down mounting of the laser array is preferred since the distance between the laser chip surface and the active region can be accurately controlled during the growth and fabrication processes. An epi-side up approach would not easily provide the necessary control of this dimension since it would require that the substrate thinning process be controlled to within a micron. Epi-side down mounting has the additional benefit of providing reduced thermal impedance.

Figure 4A:
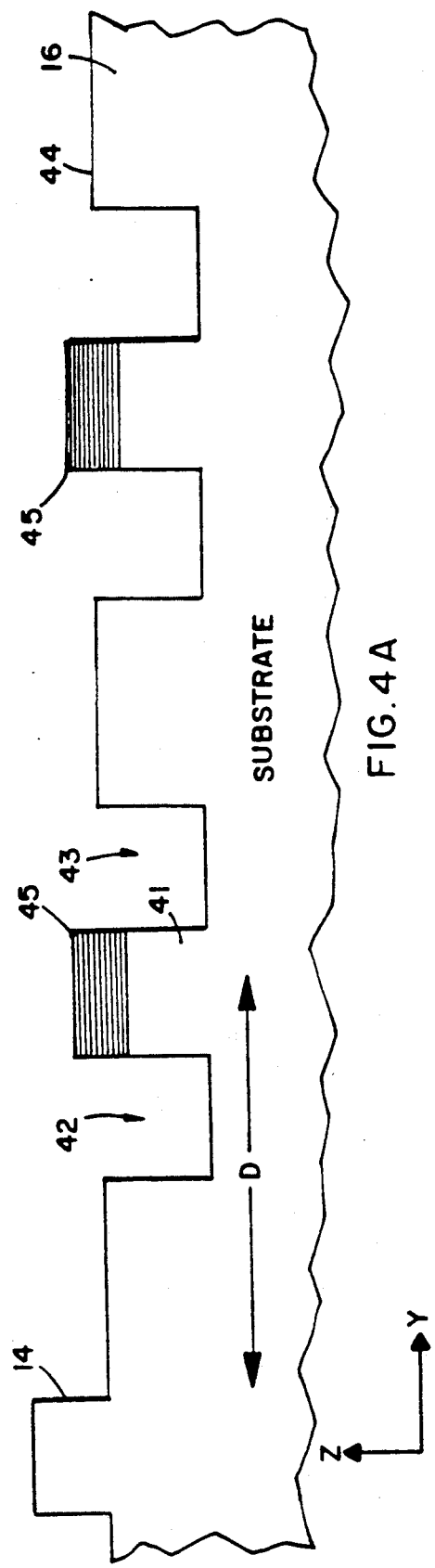
FIG. 4A is a cross-sectional view of a portion of the corrugated laser mounting area (not shown in FIG. 1) to which the laser array chip is attached.
Figure 4B:
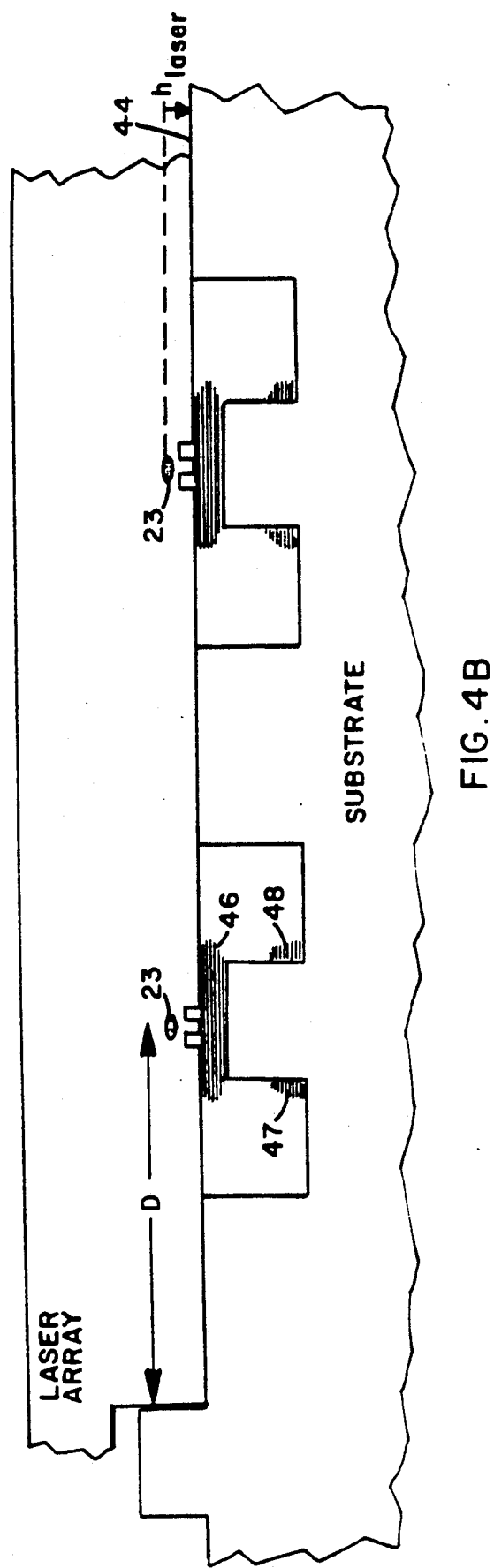
FIG. 4B illustrates a cross-sectional view of a portion of the laser chip after attachment to the mounting area shown in FIG. 4A.

A cross sectional view of a portion of the corrugated laser mounting area is shown in FIG. 4(a). Only two elements of the laser array are shown (the ones closest to pedestal 14). The laser mounting area is fabricated by processing a ridge 41 into the substrate for each laser element, with each ridge being bordered by channels 42 and 43. The height of the silicon ridge 41 is fabricated so that it is several microns below the substrate surface 44.

A controlled thickness of solder 45 (such as In or AuSn) is then deposited surface on the ridge to a height that is slightly above the substrate surface 44. This metallized ridge will electrically contact the laser and is patterned on the substrate 16 in line with the center of the fiber groove (not shown in the FIG. 4a). Pedestal 14 is located a distance D from the center of the first contact ridge 41 to match the distance shown in FIG. 2 from the edge of the mating channel to the first active region of the laser array. The matching of these distances and the equivalence of the groove pitch and active element separation result in laser/fiber alignment in the y direction as previously described.

The laser array mounting procedure is initiated by positioning the laser array over the laser mounting area using the previously described pedestals so that the chip is in abutting contact with all three pedestals simultaneously. Heat is applied to melt the solder while a downward force is applied on the laser array chip. As the solder melts, the laser array surface will come into contact with the substrate surface and the solder will extrude, resulting in the flow of excess solder 47 and 48 into the channels 42 and 43, respectively. In this manner, a controlled solder film 46 is obtained whose thickness is determined by the height difference between the top of the contact ridge (before solder is deposited) and the substrate surface 44. Containment of the excess solder in the channels also prevents spreading of the solder between the various elements of the laser array. With this approach, conventional processing technology can be used to control the height of the laser above the substrate surface, $h_{laser}$, to submicron dimensions. Alignment of the laser and fiber in the z direction is therefore obtained by control of the substrate processing (and laser growth/ processing) so that $h_{core} = h_{laser}$.

The alignment technique of the present invention is expected to provide a low cost approach to the packaging of optoelectronic components. Elimination of time consuming active alignment procedures will reduce the labor costs associated with assembly, while the use of silicon as a packaging medium offers the potential for lower materials cost via the use of batch processing technology. An additional benefit of mechanical features (pedestals and V-grooves) for component fixturing, rather than conventional materials such as epoxy, is improved in-service component mechanical stability (coupling) which will translate to enhanced reliability.

Although particular aspects of the present invention are discussed in view of the embodiment of FIGS. 1-4, it would be obvious to those skilled in the art that other modifications may be made without departing from the scope of the invention. For example, multi-mode fibers may be used instead of single-mode fibers. The most benefit, though, is realized with the use of the smaller-core single mode fibers since the fiber-laser alignment requires much greater precision which is achievable by the present invention. Additionally, the substrate may be etched with other fiber-receiving conduits other than V-grooves so long as the conduits permit tne same alignment in the x, y, and z directions as the embodiment of FIG. 1. Additionally, mounting surfaces other than the one shown in FIGS. 4a-b may be fabricated. One exemplary mounting area would consist of dielecrric platforms fabricated to a known height ($h_{dielectric}$) above the substrate surface, with solder ridges being deposited at a height slightly above $h_{dielectric}$ between the dielectric platforms. The laser chip is firmly pressed onto this mounting area so that each laser element is soldered to a solder ridge and the chip surface rests on the dielectric platforms. Thus, proper alignment exists in the z-direction so long as $h_{core} = h_{laser} + h_{dielectric}$. Although the pedestals 12 and 13 in FIG. 1 are in front of the chip, they may also be located behind the chip. However, the front-positioning is preferable because it offers flexibility in increasing chip size without affecting the axial positioning of the fibers.

We claim:

1. A method of passively aligning an array of fibers to an array of elements with active regions fabricated as a laser chip, said chip and fibers being attachable to a substrate, comprising the steps of:

forming an array of grooves in said substrate within which said fibers are positionable;

forming two front pedestal structures and one side pedestal structure at respective, predetermined locations on the upper surface of said substrate wherein each pedestal structure has a contact surface;

defining a vertical sidewall of said laser chip to form a mating channel whereby an edge of said sidewall is a predetermined distance from an active region of the nearest laser element of said array; and mounting said laser chip epi-side down on said substrate by abutting a front face of said chip with the contact surfaces of said two front pedestals and by abutting the defined sidewall of said mating channel to the contact surface of said side pedestal, whereby a center line of each fiber when positioned within a respective groove is aligned to a center line of a respective element active region thereby allowing said active regions to optically access said fibers.

2. The method of passive alignment as recited in claim wherein said mounting step includes:

forming a corrugated mounting pattern within the upper surface of said substrate to create an array of contact ridges each bordered by channels and having an exposed contact surface at a height below the upper surface of said substrate;

depositing a controllable thickness of solder on each ridge sufficient to create an electrical contact surface at a height above the upper surface of said substrate;

positioning said chip above said substrate and in abutting contact with said pedestals; and concurrently applying sufficient heat to melt the solder and applying a downward force on said laser chip while maintaining the abutting contact between said pedestals and chip until said chip is secured on said substrate.

3. A method of passively aligning at least one optical receiving element to a light generating chip having at least one active element wherein said chip and receiving elements are attachable to a substrate, comprising the steps of:

forming two front pedestal structures and one side pedestal structure at respective, predetermined locations on a surface of said substrate wherein each pedestal structure has a contact surface;

defining a vertical sidewall of said light generating chip to form a mating channel whereby an edge of said sidewall is a predetermined distance from the active elements of said chip;

defining a reference surface relative to said substrate surface;

mounting said chip epi-side down on said reference surface by abutting a front face of said chip with the contact surfaces of said two front pedestals and by abutting the defined sidewall of said mating channel to the contact surface of said side pedestal, whereby said active elements are at a known height above said substrate surface and a known lateral displacement from the edge of said sidewall; and positioning said optical receiving elements on said substrate surface relative to the locations of said pedestals and said active elements so that a center line of each receiving element is aligned to a center line of a respective active element, thereby allowing said active elements to optically access said receiving elements.

4. The method of passive alignment as recited in claim said optical receiving elements include an array of single-mode optical fibers.

5. The method of passive alignment as recited in claim said optical receiving elements include an array of multi-mode optical fibers.

6. The method of passive alignment as recited in claim 4 or 5 wherein:
said chip includes an array of lasers.

7. The method of passive alignment as recited in claim 3 wherein:
said optical receiving element is a fiber and said chip includes a laser.

8. The method of passive alignment as recited in claim 4 or 5 wherein the step of positioning said array of receiving elements on said substrate surface includes the steps of:
forming an array of fiber-receiving grooves in said substrate for receiving said array of fibers.

9. The method of passive alignment as recited in claim 3 wherein:
said reference surface is said substrate surface.

10. The method of passive alignment as recited in claim 9 wherein said mounting step further includes the steps of:
forming a corrugated mounting pattern within said substrate surface to create an array of contact ridges each bordered by channels and having an exposed contact surface at a height below said substrate surface;
depositing a controllable thickness of solder on each ridge sufficient to create an electrical contact surface at a height above said substrate surface;
positioning said chip above said substrate and in abutting contact with said pedestals; and
concurrently applying sufficient heat to melt the solder and applying a downward force on said chip while maintaining the abutting contact between said pedestals and chip until said chip is secured on said substrate wherein each active element is soldered to the electrical contact surface of a respective contact ridge.

11. The method of passive alignment as recited in claim wherein said mounting step further includes the steps of:
forming a pattern of dielectric ridges on said substrate surface wherein an exposed upper surface of each dielectric ridge is coplanar with said reference surface;
depositing a controllable thickness of solder between each dielectric ridge to form an electrical contact ridge having an upper surface above said reference surface;
positioning said chip above said substrate and in abutting contact with said pedestals; and
concurrently applying sufficient heat to melt the solder and applying a downward force on said chip while maintaining the abutting contact between said pedestals and chip until said chip is secured on said substrate wherein each active element is soldered to the upper surface of a respective electrical contact ridge.

12. A method of passively aligning a fiber to a laser fabricated on a chip wherein said chip and fiber are attachable to a substrate, comprising the steps of:
forming two front pedestal structures and one side pedestal structure at respective, predetermined locations on a surface of said substrate wherein each pedestal structure has a contact surface;
defining a vertical sidewall of said laser chip to form a mating channel whereby an edge of said sidewall is a predetermined distance from the laser;
defining a reference surface relative to said substrate surface;
mounting said chip epi-side down on said reference surface by abutting a front face of said chip with the contact surfaces of said two front pedestals and by abutting the defined sidewall of said mating channel to the contact surface of said side pedestal, whereby said laser is at a known height above said substrate surface and a known lateral displacement from the edge of said sidewall; and
positioning said fiber on said substrate surface relative to the locations of said pedestals and said laser so that a center line of said fiber is aligned to a center line of said laser, thereby allowing said laser to optically access said fiber.

13. The method of passive alignment as recited in claim 12 wherein:
said fiber is single-mode.

14. The method of passive alignment as recited in claim 13 wherein the step of positioning said fiber on said substrate surface includes the steps of:
forming a fiber-receiving groove in said substrate for receiving said fiber.

15. The method of passive alignment as recited in claim 12 wherein:
said reference surface is said substrate surface.

16. The method of passive alignment as recited in claim 15 wherein said mounting step further includes the steps of:
forming a corrugated mounting pattern within said substrate surface to create a contact ridge bordered by channels and having an exposed contact surface at a height below said substrate surface;
depositing a controllable thickness of solder on said ridge sufficient to create an electrical contact surface at a height above said substrate surface;
positioning said chip above said substrate and in abutting contact with said pedestals; and
concurrently applying sufficient heat to melt the solder and applying a downward force on said chip while maintaining the abutting contact between said pedestals and chip until said chip is secured on said substrate wherein the laser is soldered to the contact surface of said contact ridge.

17. The method of passive alignment as recited in claim 12 wherein said mounting step further includes the steps of:
forming a pair of dielectric ridges on said substrate surface wherein the exposed upper surface of each dielectric ridge is coplanar with said reference surface;

depositing a controllable thickness of solder between said dielectric ridges to form an electrical contact ridge having an upper surface above said reference surface;

positioning said chip above said substrate and in abutting contact with said pedestals; and concurrently applying sufficient heat to melt the solder and applying a downward force on said chip while maintaining the abutting contact between said pedestals and chip until said chip is secured on said substrate wherein the laser is soldered to the upper surface of said electrical contact ridge.

* * * * *